US008952421B2

(12) United States Patent
Curatola et al.

(10) Patent No.: US 8,952,421 B2
(45) Date of Patent: Feb. 10, 2015

(54) RF POWER HEMT GROWN ON A SILICON OR SIC SUBSTRATE WITH A FRONT-SIDE PLUG CONNECTION

(71) Applicant: Infineon Technologies Austria AG, Villach (AT)

(72) Inventors: Gilberto Curatola, Villach (AT); Gianmauro Pozzovivo, Villach (AT); Simone Lavanga, Drobollach (AT)

(73) Assignee: Infineon Technologies Austria AG, Villach (AT)

( * ) Notice: Subject to any disclaimer, the term of this patent is extended or adjusted under 35 U.S.C. 154(b) by 47 days.

(21) Appl. No.: 13/651,896

(22) Filed: Oct. 15, 2012

(65) Prior Publication Data
US 2014/0103398 A1     Apr. 17, 2014

(51) Int. Cl.
*H01L 29/778*     (2006.01)
(52) U.S. Cl.
USPC ........... 257/194; 438/478; 438/285; 438/106; 438/404; 438/172
(58) Field of Classification Search
USPC ................... 257/194, 190, 191, 192, E29.246
See application file for complete search history.

(56) References Cited

U.S. PATENT DOCUMENTS

2013/0168737 A1*   7/2013   Prechtl et al. ............... 257/194

* cited by examiner

*Primary Examiner* — Chuong A Luu
*Assistant Examiner* — Rodolfo Fortich
(74) *Attorney, Agent, or Firm* — Murphy, Bilak & Homiller, PLLC (57) ABSTRACT

A compound semiconductor device includes a plurality of high-resistance crystalline silicon epitaxial layers and a plurality of activated dopant regions disposed in a same region of at least some of the epitaxial layers so that the activated dopant regions are aligned in a vertical direction perpendicular to a main surface of the epitaxial layers. The compound semiconductor device further includes an III-nitride compound semiconductor device structure disposed on the main surface of the epitaxial layers. The III-nitride compound semiconductor device structure has a source, a drain and a gate. An electrically conductive structure is formed from the activated dopant regions. The electrically conductive structure extends in the vertical direction through the epitaxial layers with the activated dopant regions toward the III-nitride compound semiconductor device structure, and is electrically connected to the source.

20 Claims, 10 Drawing Sheets

RF POWER HEMT GROWN ON A SILICON OR SIC SUBSTRATE WITH A FRONT-SIDE PLUG CONNECTION

TECHNICAL FIELD

The instant application relates to RF power HEMTs, and more particularly to RF power HEMTs with a front-side plug connection.

BACKGROUND

Radio frequency (RF) GaN/AlGaN high electron mobility transistors (HEMTs) typically have a through substrate via (TSV) plug connection for connecting the source at the front-side of the device to a metallization disposed on the back-side of the device. A source plug connection is needed to realize high efficiency, high frequency power applications, and for ease of device packaging. Usually semi-insulating or high-resistivity substrates are required, in order to minimize high frequency losses.

Conventional approaches for realizing a source plug connection, when using semi-insulating or high-resistivity substrates, is a TSV source plug connection. The TSV plug connection is fabricated by forming an opening through the substrate from the substrate back-side after the substrate is thinned, i.e. at the end of the HEMT device fabrication process, and filling the opening with a conductive material. Other conventional front-side source plug connections are fabricated using deep-RIE (reactive ion etching) or laser drilling to form an opening through the substrate from the front-side during frontend processing, through the thick substrate prior to thinning. In each case, the processes involved increase cost and are not fully compatible with standard CMOS (complementary metal oxide semiconductor) processing.

SUMMARY

According to the embodiments described herein, an RF HEMT is realized with a front-side plug which connects the source of the RF HEMT to a metallized back-side of the device. The RF HEMT can be formed on a Si substrate with a [111] crystal orientation or on a SiC substrate with a [100] crystal orientation. The substrate can be conductive or insulating. The processes employed to form the front-side plug connection are fully compatible with standard CMOS processing such as trench etching, plug filling, ion implantation, dopant activation, wafer grinding, etc.

According to an embodiment of a method of manufacturing a compound semiconductor device, the method comprises: growing a plurality of high-resistance crystalline silicon epitaxial layers on a crystalline semiconductor substrate; forming a plurality of inactive dopant regions in at least some of the epitaxial layers, the inactive dopant regions being aligned in a vertical direction perpendicular to a main surface of the epitaxial layers; forming a III-nitride compound semiconductor device structure on the epitaxial layers, the III-nitride compound semiconductor device structure including a source, a drain and a gate; and activating the inactive dopant regions to form an electrically conductive structure from the activated dopant regions which extends from the substrate in the vertical direction toward the III-nitride compound semiconductor device structure and is electrically connected to the source. Dopant activation is easily achieved during III-nitride compound semiconductor growth.

According to an embodiment of a compound semiconductor device, the compound semiconductor device comprises a plurality of high-resistance crystalline silicon epitaxial layers and a plurality of activated dopant regions disposed in a same region of at least some of the epitaxial layers so that the activated dopant regions are aligned in a vertical direction perpendicular to a main surface of the epitaxial layers. An III-nitride compound semiconductor device structure is disposed on the main surface of the epitaxial layers. The III-nitride compound semiconductor device structure includes a source, a drain and a gate. An electrically conductive structure is formed from the activated dopant regions. The electrically conductive structure extends in the vertical direction through the epitaxial layers with the activated dopant regions toward the III-nitride compound semiconductor device structure, and is electrically connected to the source.

According to an embodiment of an RF compound semiconductor device, the RF compound semiconductor device comprises a plurality of high-resistance crystalline silicon epitaxial layers and a plurality of activated dopant regions disposed in a same region of at least some of the epitaxial layers so that the activated dopant regions align in a vertical direction perpendicular to a first main surface of the epitaxial layers. An III-nitride compound semiconductor device structure is disposed on the main surface of the epitaxial layers. The III-nitride compound semiconductor device structure includes a source, a drain and a gate of an RF device. A metallization is disposed on a second main surface of the epitaxial layers which opposes the first main surface. An electrically conductive structure is formed from the activated dopant regions. The electrically conductive structure contacts the metallization at one end and extends in the vertical direction through the epitaxial layers, with the activated dopant regions toward the III-nitride compound semiconductor device structure. The electrically conductive structure is electrically connected to the source of the RF device. To reduce RF substrate losses, the substrate can be thinned partly or completely.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Described next are embodiments of an RF HEMT device having a front-side plug connection to a metallized back-side of the device. The term HEMT is also commonly referred to as HFET (heterostructure field effect transistor), MODFET (modulation-doped FET) and MESFET (metal semiconductor field effect transistor). The terms compound semiconductor device, HEMT, HFET, MESFET and MODFET are used interchangeably herein to refer to an III-nitride device incorporating a junction between two materials with different band gaps (i.e. a heterojunction) as the channel. For example, GaN may be combined with AlGaN or InGaN to form the channel. The III-nitride device may have AlInN/AlN/GaN barrier/spacer/buffer layer structures.

Figure 1:
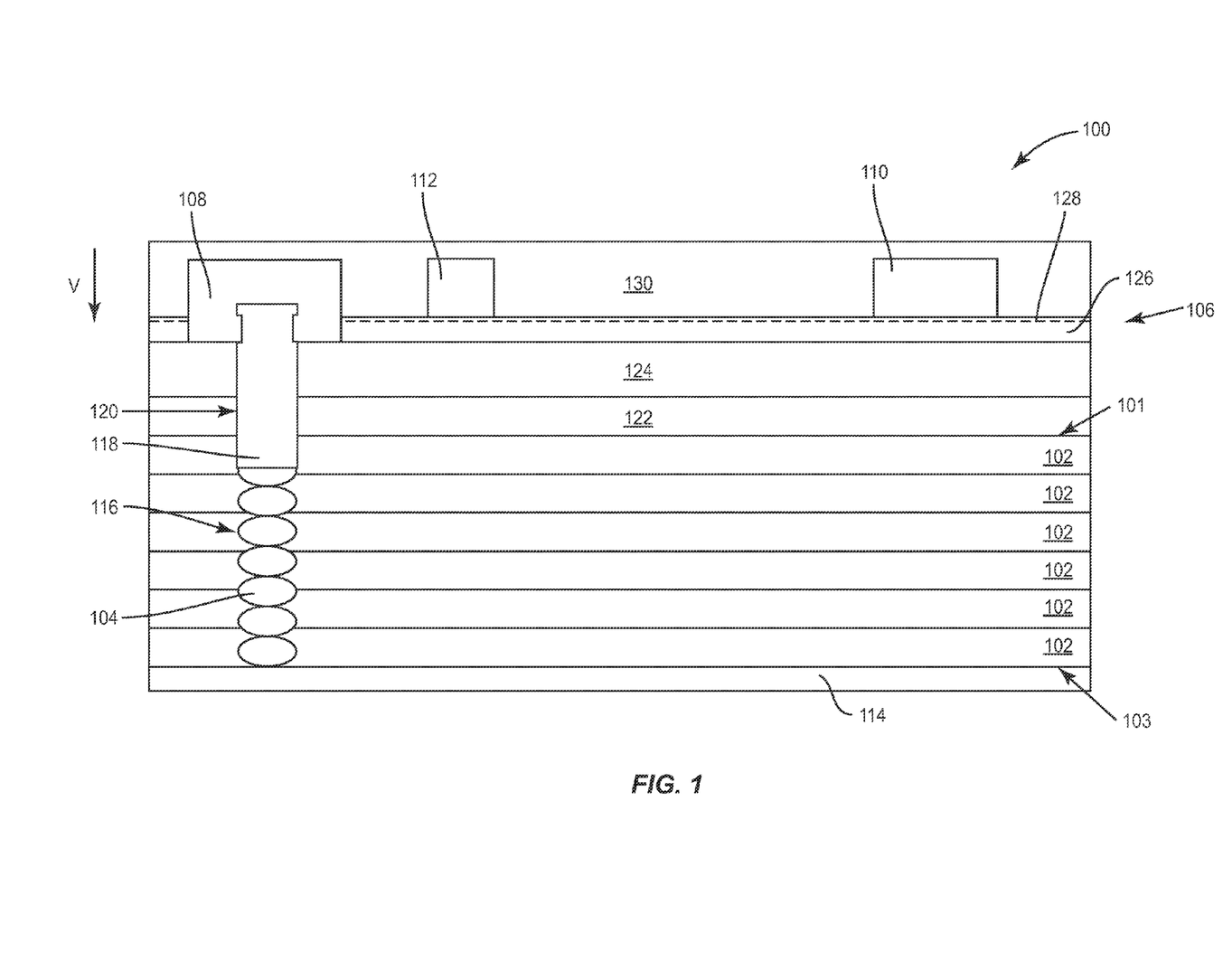
FIG. 1 illustrates a cross-sectional view of a compound semiconductor device having a front-side plug connection to a metallized back-side of the device.

FIG. 1 illustrates a cross-sectional view of an RF compound semiconductor device 100 which includes a plurality of high-resistance crystalline silicon epitaxial layers 102 and a plurality of activated dopant regions 104 disposed in a same region of at least some of the epitaxial layers 102 so that the activated dopant regions 104 align in a vertical direction (v) perpendicular to a first main surface 101 of the epitaxial layers 102. The epitaxial layers 102 are 'high-resistance' in that they are undoped (i.e. not intentionally doped, but may have some unintentional doping which is inherent with epitaxial growth processes) or minimally doped but still of a high-resistance, i.e. insulating and not conductive. This is in contrast to intentionally highly-doped epitaxial layers which have a much higher dopant concentration (and thus higher current flow) as compared to the high-resistance epitaxial layers 102 which have a significantly lower dopant concentration (and thus lower current flow).

The epitaxial layers 102 are of a sufficiently high resistance to provide adequate isolation for an RF device constructed as part of an III-nitride compound semiconductor device structure 106 disposed on the main surface 101 of the epitaxial layers 102. The III-nitride compound semiconductor device structure 106 includes a source 108, a drain 110 and a gate 112 of an RF device. A metallization 114 is formed on a second main surface 103 of the epitaxial layers 102, which opposes the first main surface 101. The metallization 114 is referred to herein as 'back-side metallization'.

The activated dopant regions 104 disposed in the epitaxial layers 102 form an electrically conductive structure 116 which contacts the back-side metallization 114 at one end. The electrically conductive structure 116 extends in the vertical direction from the back-side metallization 114 through the epitaxial layers 102 which have the activated dopant regions 104 toward the III-nitride compound semiconductor device structure 106. The electrically conductive structure 116 is electrically connected to the source 108 of the RF device according to the embodiment illustrated in FIG. 1.

The electrical connection between the source 108 of the RF device and the electrically conductive structure 116 formed by the activated dopant regions 104 is completed by an electrically conductive material 118 such as a metal or metal alloy disposed in a trench 120. The trench 120 extends in the vertical direction through the III-nitride compound semiconductor device structure 106 to the activated dopant region 104 closest to the III-nitride compound semiconductor device structure 106. The electrically conductive material 118 disposed in the trench 120 contacts the electrically conductive structure 116 at a first end and contacts the source 108 of the RF device at a second opposing end.

In either case, the trench 120 is formed from the front-side of the device instead of the back-side. Each epitaxial layer 102 has at least one of the activated dopant regions 104 according to this embodiment. As such, the trench 120 extends from the front-side of the device completely through the III-nitride compound semiconductor device structure 106 and partly into the uppermost epitaxial layer 102 to make contact with the activated dopant region 104 closest to the III-nitride compound semiconductor device structure 106.

In one embodiment, the III-nitride compound semiconductor device structure 106 includes one or more transition layers 122 on the first main surface 101 of the epitaxial layers 102, GaN 124 on the one or more transition layers 122 and GaN alloy 126 such as AlGaN or InGaN on the GaN 124. The compound semiconductor layers of the III-nitride compound semiconductor device structure 106 can be formed by metal organic chemical vapor deposition (MOCVD) or any other known process. The III-nitride compound semiconductor device structure 106 may also have AlInN/AlN/GaN barrier/spacer/buffer layer structures.

In general with GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas, such as a 2DEG (two-dimensional electron gas) or 2DHG (two-dimensional hole gas), forms the conductive channel region 128 of the RF device. A thin, e.g. 1-2 nm, AlN layer can be provided between the GaN 124 and the GaN alloy 126 to minimize alloy scattering and enhance 2DEG mobility. In general, any III-nitride based heterostructure can be used where a band discontinuity is responsible for the device concept.

The source 108 of the compound semiconductor device 100 extends at least into the GaN alloy 126 in contact with one end of the channel region 128. The drain 110 may or may not also extend at least into the GaN alloy 126 in contact with the other end of the channel region 128, and is spaced apart from the source 108 by the channel region 128. The source 108 and drain 110 can be formed by doping defined regions of the GaN alloy 126 and/or metal deposition. The gate 112 is provided on or in the GaN alloy 126, and controls the channel region 128 as is well known in the GaN arts. An insulating material 130 such as SiN can cover the source 108, drain 110 and gate 112.

The compound semiconductor device 100 is a quasi-vertical device in that the source 108 is contacted at opposite sides of the device, and current flows partly in a lateral direction and partly in a vertical direction between the source 108 and drain 110. The vertical portion of the current flow path is provided by the channel region 128. The vertical portion of the current flow path is provided by the electrically conductive material 118 disposed in the trench 120 and the electrically conductive structure 116 formed by the activated dopant regions 104 disposed in the epitaxial layers 102. The electrically conductive material 118 disposed in the trench 120 and the electrically conductive structure 116 formed by the activated dopant regions 104 connect the source 108 of the RF device to the back-side metallization 114 as shown in FIG. 1. Alternatively, the electrically conductive material 118 disposed in the trench 120 and the electrically conductive structure 116 formed by the activated dopant regions 104 can connect the drain 110 of the RF device to the back-side metallization 114. In each case, the RF device can be normally-on or normally-off, as is well known in the compound semiconductor transistor arts.

FIGS. 2A through 2E illustrate cross-sectional views of the compound semiconductor device 100 during different stages of manufacturing according to an embodiment. The processes employed to form the front-side plug connection of the RF device are fully compatible with standard CMOS processing e.g. such as trench etching, plug filling, ion implantation, dopant activation, wafer grinding, etc. as explained next in more detail.

Figure 2A:
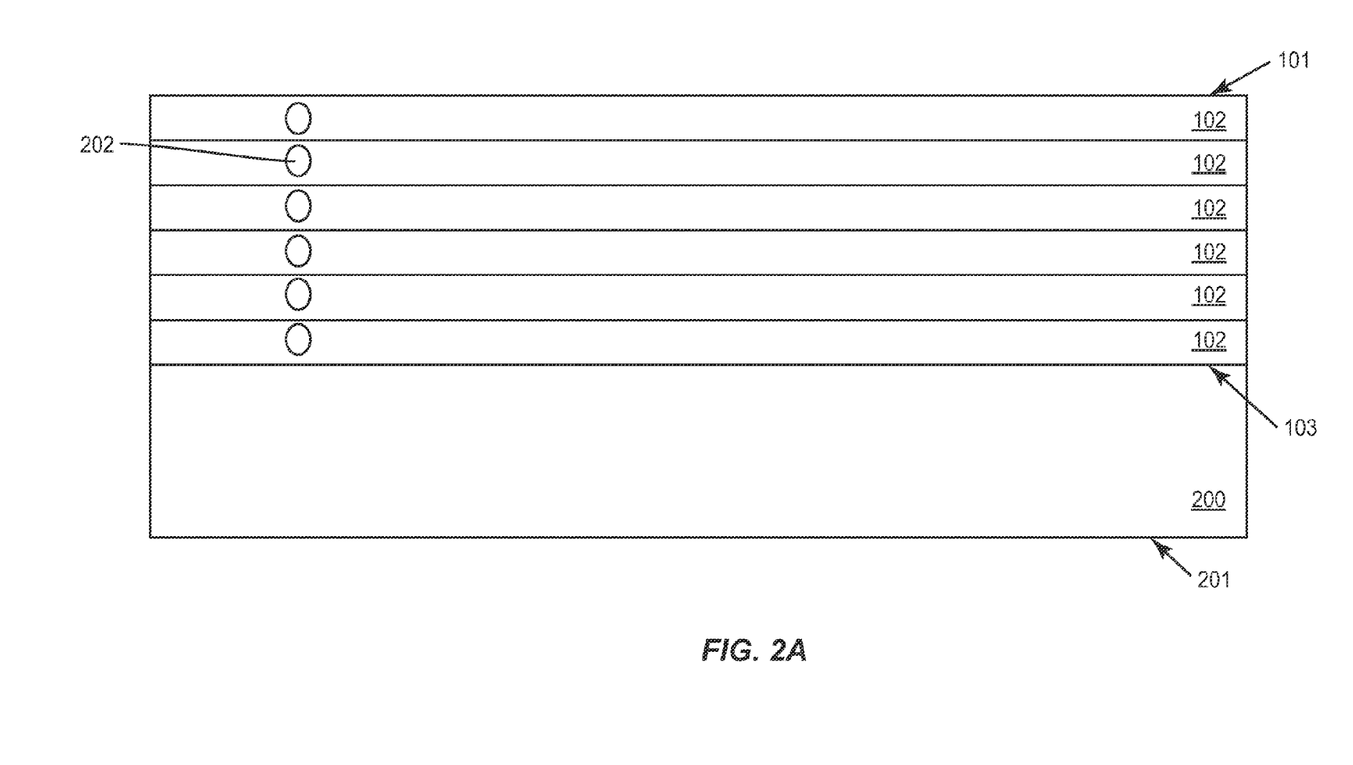
FIGS. 2A through 2E illustrate cross-sectional views of a compound semiconductor device having a front-side plug connection to a metallized back-side of the device at different stages of a manufacturing process according to one embodiment.

FIG. 2A shows the device after a plurality of high-resistance crystalline silicon epitaxial layers 102 are grown on a crystalline semiconductor substrate 200. In one embodiment, the substrate 200 is a doped or undoped crystalline silicon substrate having a growth surface with a [111] crystal orientation on which the epitaxial layers 102 are grown. In another embodiment, the substrate 200 is a doped or undoped crystalline silicon carbide substrate having a growth surface with a [100] crystal orientation on which the epitaxial layers 102 are grown. In each case, the epitaxial layers 102 are grown and implanted with dopants in succession to form inactive dopant regions 202 in some or all of the epitaxial layers 102. That is, the lowermost epitaxial layer 102 is grown on the substrate 200 and implanted with dopants such as As or P to form an inactive dopant region 202 in the lowermost epitaxial layer 102 before the next epitaxial layer 102 is grown. This sequential process is continued until an overall desired thickness is achieved for the high-resistance epitaxial layers 102. The resulting structure is shown in FIG. 2A.

The inactive dopant regions 202 are formed in the epitaxial layers 102 by ion implantation. Ion implantation is the process of depositing chemical dopants into the substrate 200 by bombarding the substrate 200 with high-energy ions of the chemical being deposited. This process involves the collision of the highly-energetic dopant ions with the atoms of the substrate 200, and is therefore destructive to the material structure of the substrate 200 being implanted. For example, silicon damage caused by ion implantation includes: the formation of crystal defects such as Frenkel defects, vacancies, di-vacancies, higher-order vacancies, and interstitials; the creation of local zones of amorphous material within the crystalline structure of the substrate 200; and the formation of continuous amorphous layers as the localized amorphous regions grow and overlap. The ion-implanted substrate 200 can be restored to its pre-implant condition by subjecting the substrate 200 to a reparative thermal process widely known as annealing. At least part of the desired annealing is achieved during subsequent formation of the III-nitride compound semiconductor device structure 106.

Figure 2B:
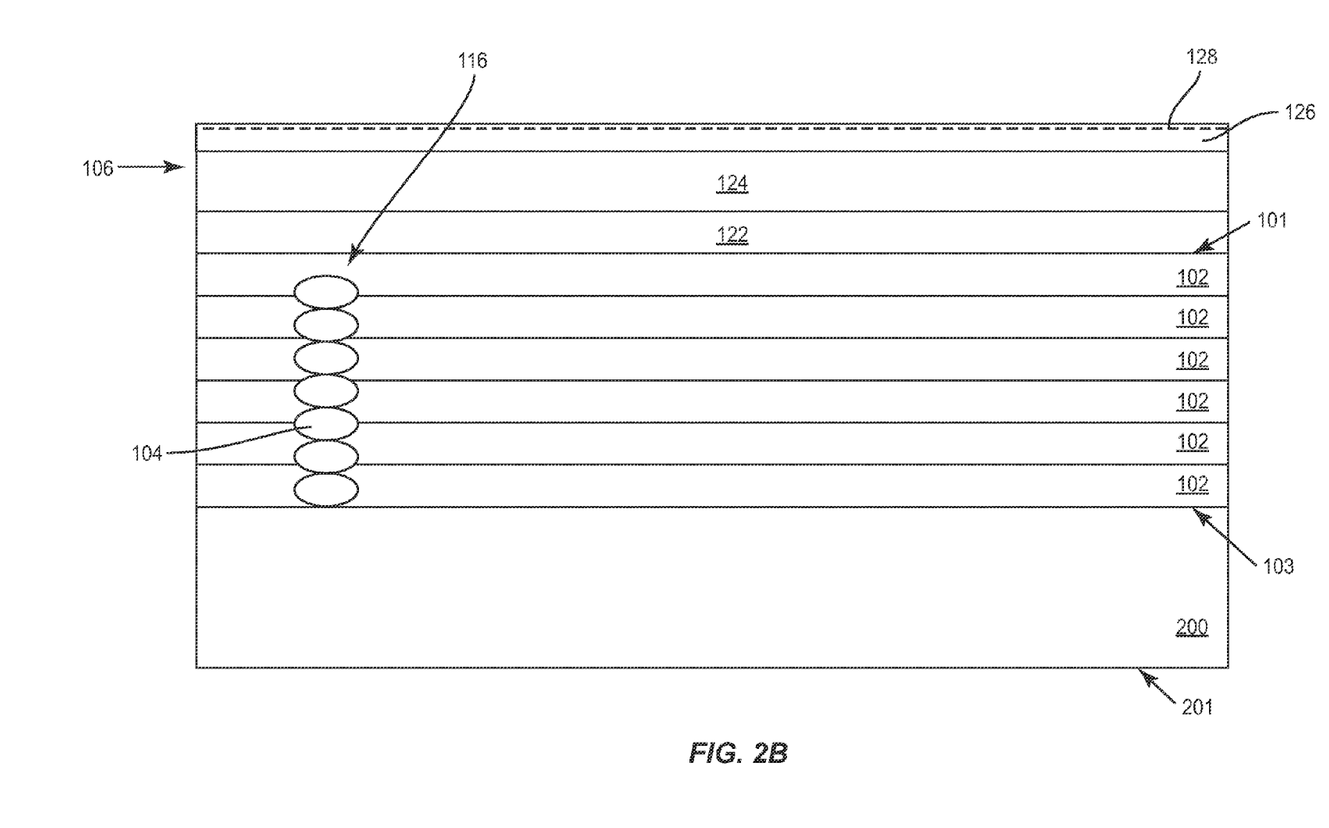

FIG. 2B shows the compound semiconductor device 100 after the III-nitride compound semiconductor device structure 106 is partly formed on the first (top) main surface 101 of the epitaxial layers 102, but before the source 108, drain 110 and gate 112 of the RF device are formed. The III-nitride compound semiconductor device structure 106 can include one or more transition layers 122 on the epitaxial layers 102, GaN 124 on the one or more transition layers 122 and GaN alloy 126 such as AlGaN or InGaN on the GaN 124 as previously described herein. In general, any suitable III-nitride compound semiconductor device structure 106 can be formed on the epitaxial layers 102. Formation of III-nitride compound semiconductor device structures on silicon epitaxial layers is well known in the semiconductor arts, and therefore no further explanation is provided in this regard.

Formation of the III-nitride compound semiconductor device structure is performed at relatively high temperatures. These elevated temperatures at least partly anneal the damage caused to the epitaxial layers 102 by the prior ion implantation process, thereby restoring the crystalline structure of the epitaxial layers 102 and activating the implanted ions to form the activated dopant regions 104 of the electrically conductive structure 116. The annealing process associated with forming the III-nitride compound semiconductor device structure 106 causes the implanted impurities to diffuse, activates the previously implanted impurities and repairs the damage caused during the ion implantation process. Additional annealing can occur later e.g. during deposition of the back-side metallization 114 and alloying of source, drain and gate contacts.

Figure 2C:
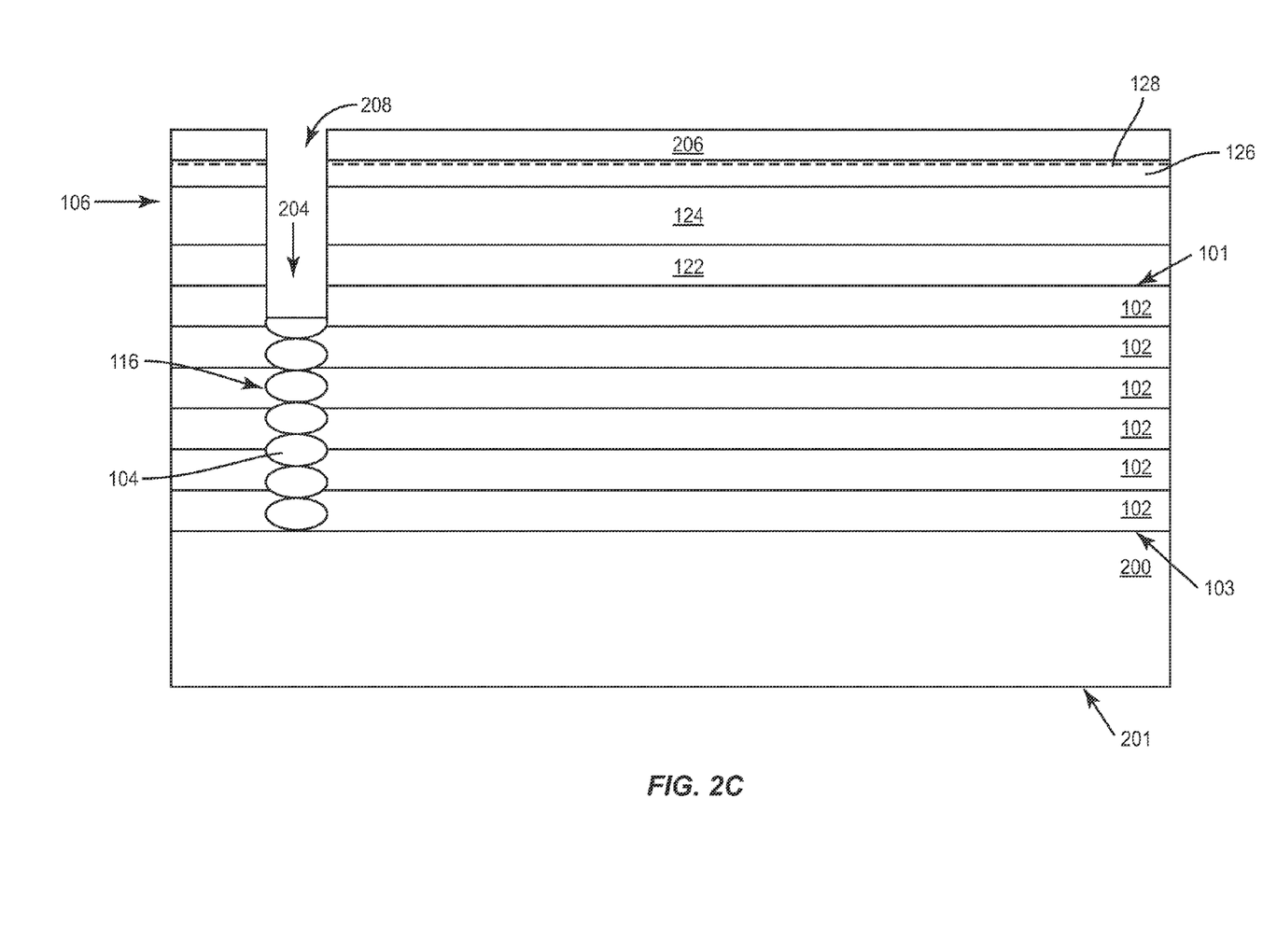

FIG. 2C shows the compound semiconductor device 100 after a trench 204 is etched through the layers 122, 124, 126 of the III-nitride compound semiconductor device structure 106 and into the epitaxial layer 102 with the uppermost activated dopant region 104. In the embodiment shown in FIGS. 2A through 2E, this involves etching the trench 204 through the III-nitride layers 122, 124, 126 of the III-nitride compound semiconductor device structure 106 and into the uppermost epitaxial layer 102 because all epitaxial layers 102 have an activated dopant region 104 which forms part of the electrically conductive structure 116. The trench 204 can be formed by depositing a mask 206 on the GaN alloy 126 and forming an opening 208 in the mask 206. The mask opening 208 is aligned with the underlying electrically conductive structure 116 formed by the activated dopant regions 104. An appropriate etch process is employed to etch the trench 204 completely through the III-nitride layers 122, 124, 126 of the III-nitride compound semiconductor device structure 106 and into the uppermost epitaxial layer 102. Etching trenches through III-nitride and silicon semiconductor materials is well known in the art, and therefore no further explanation is given in this regard.

Figure 2D:
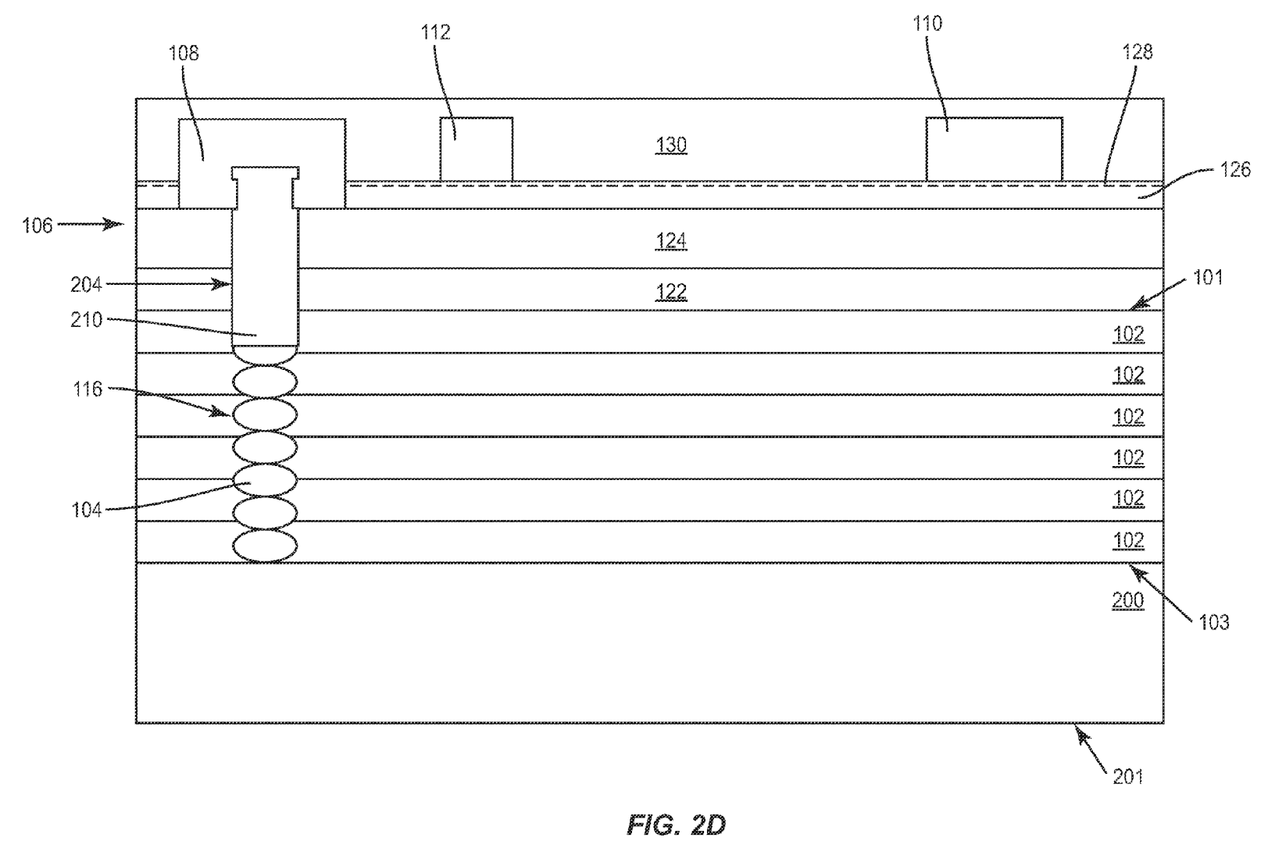

FIG. 2D shows the compound semiconductor device 100 after the source 108, drain 110 and gate 112 of the RF device are formed and after the trench 204 is filled with an electrically conductive material 210 such as a metal or metal alloy. The RF GaN HEMT device itself can be manufactured using standard silicon processes such as SiN deposition and etching, metal sputtering (e.g. Ti—Al for ohmic contacts, TaN, TiN, or Mo for the gate contact), metal patterning and etching, annealing, TEOS deposition, etching, via formation, etc. using techniques well known in the art, and therefore no further explanation is given in this regard. The trench 204 can be filled with any suitable electrically conductive material 210 which can include metals of indium (In), titanium (Ti), tungsten (W), silicon (Si), aluminum (Al), platinum (Pt), nickel (Ni), cobalt (Co), copper (Cu), tantalum (Ta) or gold (Au) for example, in a number of multi-layered or alloy combinations such as Al/Ti/Pt/Au, Ni/Au, Ti/Al, Ti/Au, Ti/Al/Ti/Au, Ti/Al/Au, Ti/TiN CoSix/TiN, TiW, TiWN, WSix using techniques well known in the art, and therefore no further explanation is given in this regard. The source 108 of the RF device is in contact with the electrically conductive material 210 disposed in the trench 204. Alternatively, the drain 110 of the RF device can contact the electrically conductive material 210 disposed in the trench 204. In either case, the other end of the electrically conductive material 210 disposed in the trench 204 is in contact with the electrically conductive structure 116 formed by the activated dopant regions 104 disposed in the epitaxial layers 102.

Figure 2E:
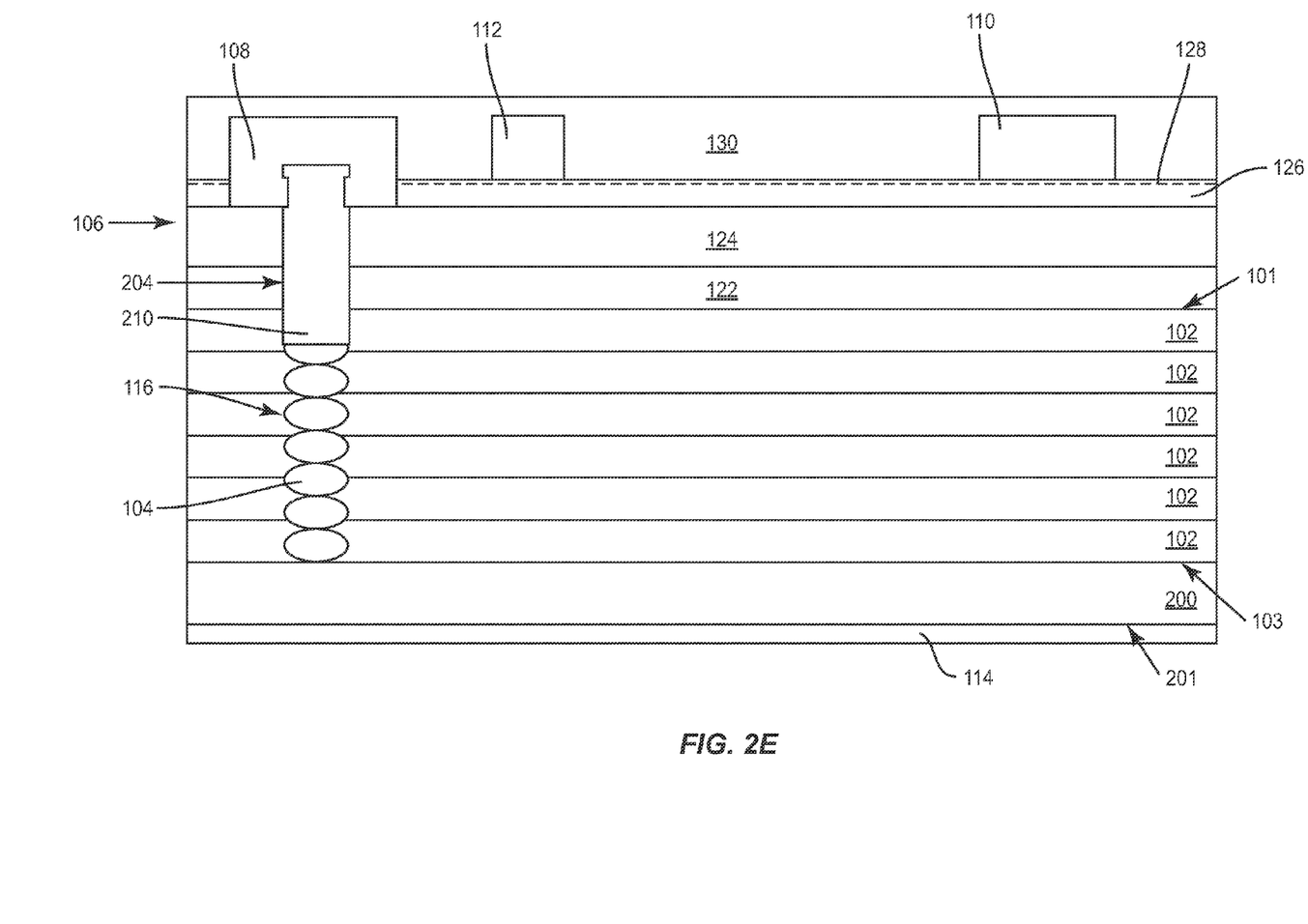

FIG. 2E shows the compound semiconductor device 100 after formation of the back-side metallization 114. The substrate 200 is highly doped and therefore conductive according to this embodiment. The heavily doped substrate 200 is thinned at a side 201 of the substrate 200 facing away from the epitaxial layers 102. The back-side metallization 114 is then formed on the side 201 of the thinned heavily doped substrate 200 facing away from the epitaxial layers 102 e.g. by any suitable metal deposition process. The thinned heavily doped substrate 200 electrically connects the back-side metallization 114 to the electrically conductive structure 116 formed by the activated dopant regions 104 disposed in the epitaxial layers 102.

Alternatively, the substrate 200 can be completely removed instead of merely thinned and the back-side metallization 114 formed on a main surface 103 of the epitaxial layers 102 from which the substrate 200 was previously removed. According to this embodiment, the electrically conductive structure 116 formed by the activated dopant regions 104 disposed in the epitaxial layers 102 has an end which faces away from the III-nitride compound semiconductor device structure 106. This end of the electrically conductive structure 116 contacts the back-side metallization 114, to provide an electrical connection between the front-side source 108 of the RF device and the back-side metallization 114 as shown in FIG. 1.

FIGS. 3A through 3D illustrate cross-sectional views of the compound semiconductor device 100 during different stages of manufacturing according to another embodiment. As with the previously described embodiments, the processes employed to form the front-side plug connection of the RF device are fully compatible with standard CMOS processing. Differently however, one or more of the epitaxial layers 102 disposed closest to the III-nitride compound semiconductor device structure 106 are devoid of the activated dopant regions 104 which form the electrically conductive structure 116.

Figure 3A:
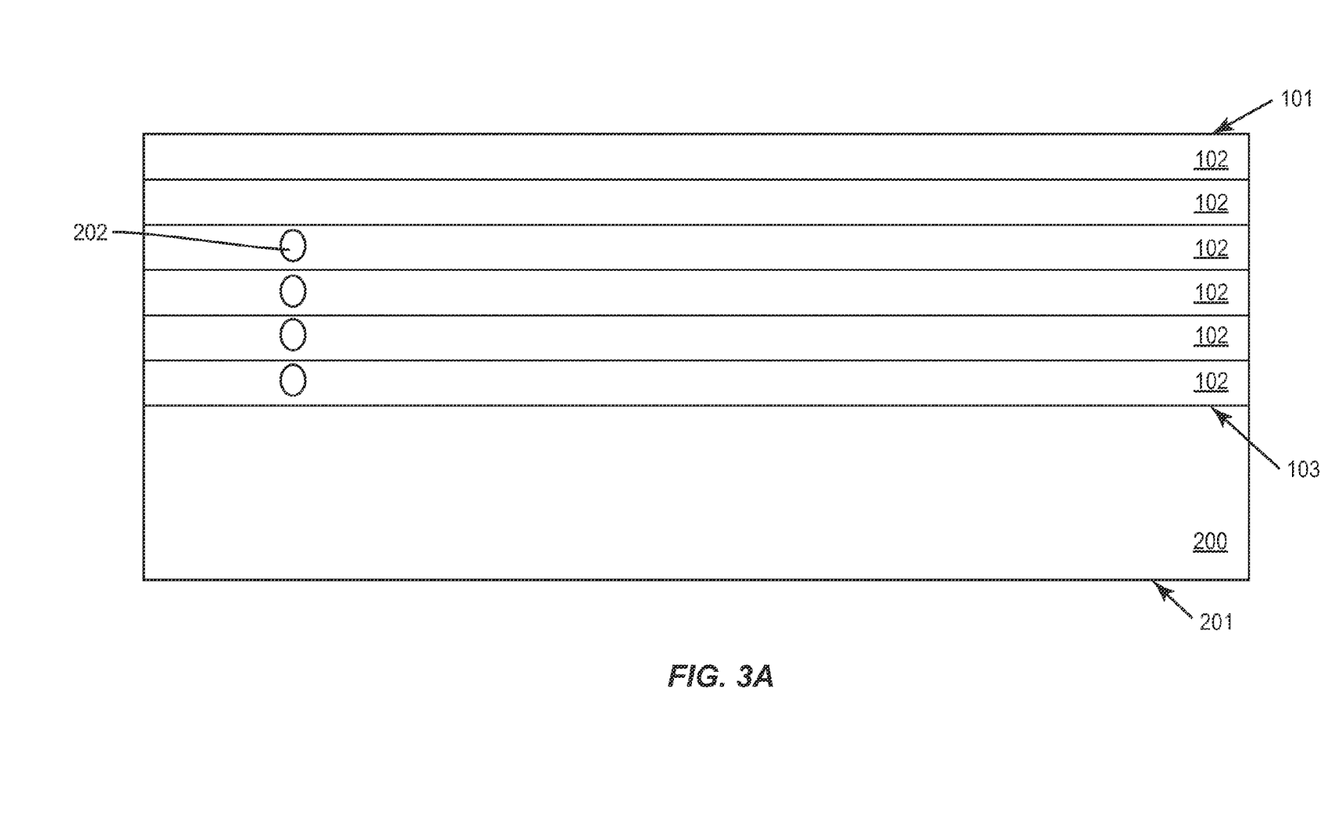
FIGS. 3A through 3D illustrate cross-sectional views of a compound semiconductor device having a front-side plug connection to a metallized back-side of the device at different stages of a manufacturing process according to another embodiment.

In more detail, FIG. 3A shows the device after a plurality of high-resistance crystalline silicon epitaxial layers 102 are grown on a crystalline semiconductor substrate 200. The substrate 200 can be doped or undoped crystalline silicon, or doped or undoped crystalline silicon carbide substrate. In each case, the epitaxial layers 102 are grown and implanted with ion dopants in succession to form inactive dopant regions 202 in all but the one or more uppermost epitaxial layers 102. That is, the lowermost epitaxial layer 102 is grown on the substrate 200 and implanted with dopants such as As or P to form an inactive dopant region 202 in the lowermost epitaxial layer 102 before another epitaxial layer 102 is grown. This sequential process is continued until all of the desired inactive dopant regions 202 are formed. One or more additional epitaxial layers 102 are then grown, but not implanted. This process is continued until the overall desired thickness is achieved for the high-resistance epitaxial layers 102.

Figure 3B:
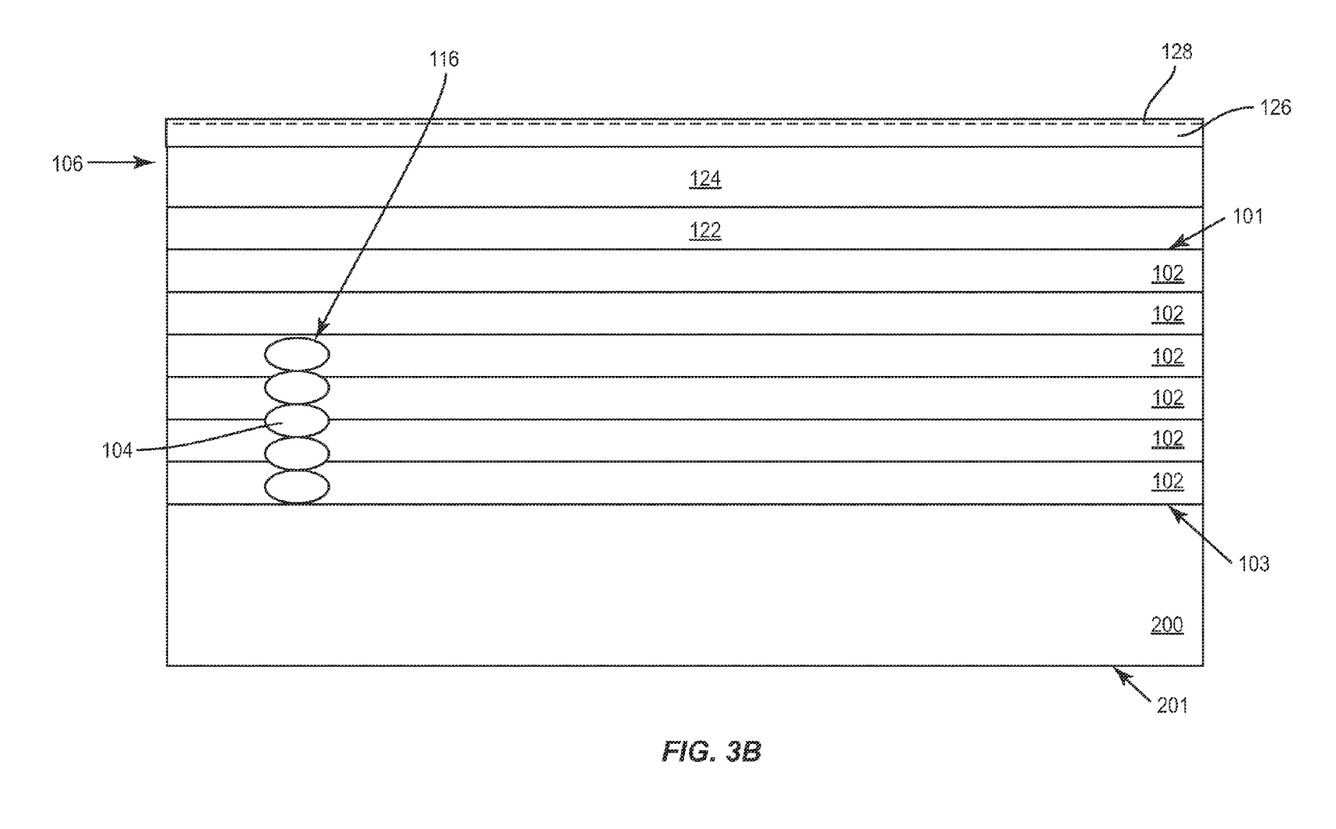

FIG. 3B shows the compound semiconductor device 100 after the III-nitride compound semiconductor device structure 106 is formed on the first (top) main surface 101 of the epitaxial layers 102. The temperatures employed to form the III-nitride compound semiconductor device structure 106 at least partly anneal the damage caused to the implanted epitaxial layers 102 by the prior ion implantation process, thereby restoring the crystalline structure of these epitaxial layers 102 and activating the implanted ions in these layers 102. Further annealing can occur later in the process, e.g. during deposition of the back-side metallization 114 and alloying of source, drain and gate contacts. One or more of the epitaxial layers 102 disposed closest to the III-nitride compound semiconductor device structure 106 are devoid of the activated dopant regions 104 according to this embodiment as shown in FIG. 3B.

Figure 3C:
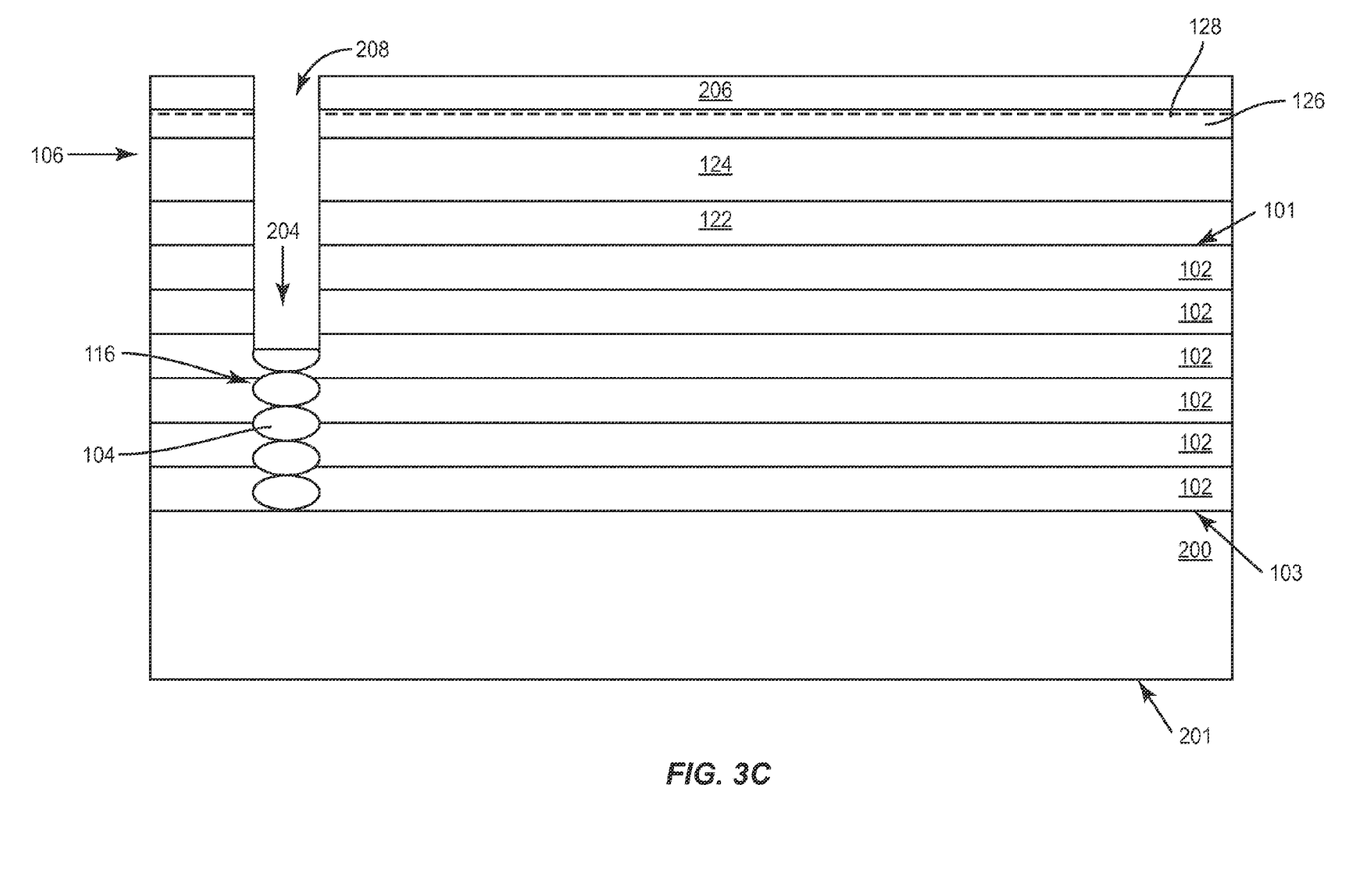

FIG. 3C shows the compound semiconductor device 100 after a trench 204 is etched through the layers 122, 124, 126 of the III-nitride compound semiconductor device structure 106 and into the epitaxial layer 102 with the uppermost activated dopant region 104. In the embodiment shown in FIGS. 3A through 3D, this involves etching the trench 204 completely through one or more of the uppermost epitaxial layers 102 from the front-side of the device. This way, the epitaxial layer 102 which includes the uppermost activated dopant region 104 can be contacted. The trench 204 can be formed as previously described herein.

Figure 3D:
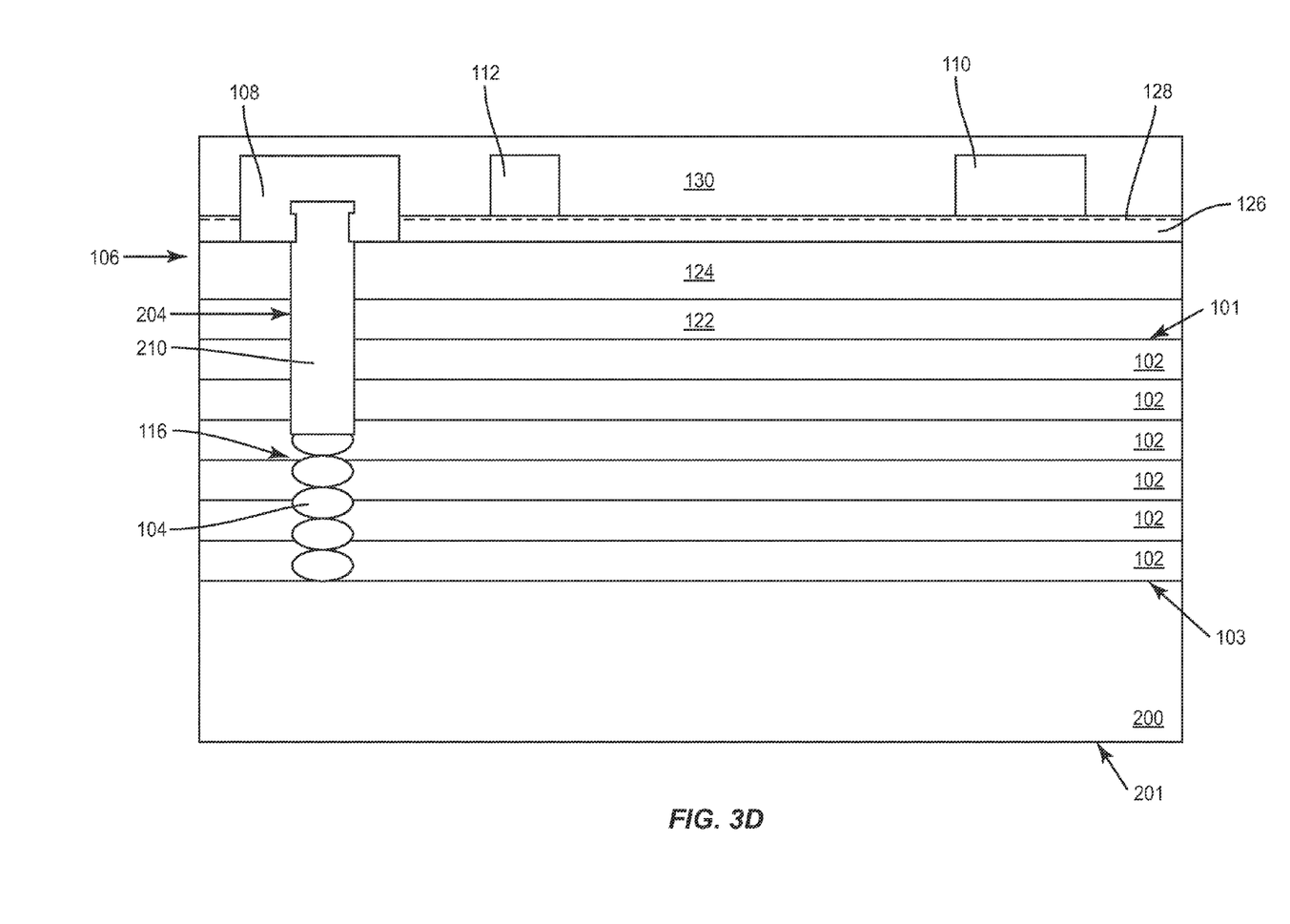

FIG. 3D shows the compound semiconductor device 100 after the source 108, drain 110 and gate 112 of the RF device are formed and after the trench 204 is filled with an electrically conductive material 210 such as a metal or metal alloy. The RF GaN HEMT device itself can be manufactured using standard silicon processes as previously described herein. The trench 204 can be filled with any suitable electrically conductive material 210 which can include metals of indium (In), titanium (Ti), tungsten (W), silicon (Si), aluminum (Al), platinum (Pt), nickel (Ni), cobalt (Co) copper (Cu), tantalum (Ta) or gold (Au), for example, in a number of multi-layered or alloy combinations such as Al/Ti/Pt/Au, Ni/Au, Ti/Al, Ti/Au, Ti/Al/Ti/Au, Ti/Al/Au, Ti/TiN CoSix/TiN, TiW, TiWN, WSix also as previously described herein. The source 108 of the RF device is in contact with the electrically conductive material 210 disposed in the trench 204. Alternatively, the drain 110 of the RF device can contact the electrically conductive material 210 disposed in the trench 204. In either case, the other end of the electrically conductive material 204 disposed in the trench 210 is in contact with the electrically conductive structure 116 formed by the activated dopant regions 104 disposed in the epitaxial layers 102.

The back-side metallization 114 is then formed. If the substrate 200 is highly doped and conductive, the substrate 200 can be thinned at a side 201 of the substrate 200 facing away from the epitaxial layers 102 and the back-side metallization 114 can be formed on the side 201 of the thinned heavily doped substrate 200 facing away from the epitaxial layers 102, e.g. as shown in FIG. 2E. The thinned heavily doped substrate 200 electrically connects the back-side metallization 114 to the electrically conductive structure 116 formed by the activated dopant regions 104 disposed in the lower epitaxial layers 104 according to this embodiment. Alternatively, the substrate 200 can be completely removed and the back-side metallization 114 formed on a main surface 103 of the epitaxial layers 102 from which the substrate 200 was removed e.g. as shown in FIG. 1. According to this alternative embodiment, the electrically conductive structure 116 formed by the activated dopant regions 104 has an end which faces away from the III-nitride compound semiconductor device structure 106. This end of the electrically conductive structure 116 contacts the back-side metallization 114, to provide an electrical connection between the front-side source 108 of the RF device and the back-side metallization 114.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a compound semiconductor device, comprising:

growing a plurality of high-resistance crystalline silicon epitaxial layers on a crystalline semiconductor substrate;
forming a plurality of inactive dopant regions in at least some of the epitaxial layers, the inactive dopant regions being aligned in a vertical direction perpendicular to a main surface of the epitaxial layers;
forming a III-nitride compound semiconductor device structure on the epitaxial layers, the III-nitride compound semiconductor device structure including a source, a drain and a gate; and
activating the inactive dopant regions to form an electrically conductive structure from the activated dopant regions which extends from the substrate in the vertical direction toward the III-nitride compound semiconductor device structure and is electrically connected to the source.

2. The method of claim 1, wherein the substrate is a doped or undoped crystalline silicon substrate having a growth surface with a [111]crystal orientation on which the epitaxial layers are grown.

3. The method of claim 1, wherein the substrate is a doped or undoped crystalline silicon carbide substrate having a growth surface with a [100] crystal orientation on which the epitaxial layers are grown.

4. The method of claim 1, wherein each epitaxial layer has at least one of the activated dopant regions.

5. The method of claim 1, wherein one or more of the epitaxial layers disposed closest to the III-nitride compound semiconductor device structure are devoid of the activated dopant regions.

6. The method of claim 1, further comprising:
forming a trench which extends in the vertical direction through the III-nitride compound semiconductor device structure to the activated dopant region closest to the III-nitride compound semiconductor device structure;
filling the trench with an electrically conductive material which contacts the electrically conductive structure at a first end of the electrically conductive material; and
forming the source in contact with the electrically conductive material at a second end of the electrically conductive material which opposes the first end.

7. The method of claim 1, wherein the substrate is heavily doped, the method further comprising:
thinning the heavily doped substrate at a side of the heavily doped substrate facing away from the epitaxial layers; and
forming a metallization on the side of the thinned heavily doped substrate facing away from the epitaxial layers so that the metallization is electrically connected to the electrically conductive structure through the thinned heavily doped substrate.

8. The method of claim 1, further comprising:
removing the substrate; and
forming a metallization on a main surface of the epitaxial layers from which the substrate was removed so that the metallization contacts an end of the electrically conductive structure facing away from the III-nitride compound semiconductor device structure.

9. The method according to claim 1, wherein the epitaxial layers are grown and implanted with dopants in succession to form the inactive dopant regions.

10. The method of claim 1, wherein forming the III-nitride compound semiconductor device structure on the epitaxial layers comprises:
forming one or more transition layers on the epitaxial layers;
forming GaN on the one or more transition layers; and
forming a GaN alloy on the GaN.

11. A compound semiconductor device, comprising:
a plurality of high-resistance crystalline silicon epitaxial layers;
a plurality of activated dopant regions disposed in a same region of at least some of the epitaxial layers so that the activated dopant regions are aligned in a vertical direction perpendicular to a main surface of the epitaxial layers;
an III-nitride compound semiconductor device structure disposed on the main surface of the epitaxial layers, the III-nitride compound semiconductor device structure including a source, a drain and a gate; and
an electrically conductive structure formed from the activated dopant regions, the electrically conductive structure extending in the vertical direction through the epitaxial layers with the activated dopant regions toward the III-nitride compound semiconductor device structure and being electrically connected to the source.

12. The compound semiconductor device of claim 11, wherein each epitaxial layer has at least one of the activated dopant regions.

13. The compound semiconductor device of claim 11, wherein one or more of the epitaxial layers disposed closest to the III-nitride compound semiconductor device structure are devoid of the activated dopant regions.

14. The compound semiconductor device of claim 11, further comprising:
a trench extending in the vertical direction through the III-nitride compound semiconductor device structure to the activated dopant region closest to the III-nitride compound semiconductor device structure; and
an electrically conductive material disposed in the trench which contacts the electrically conductive structure at a first end and contacts the source at a second opposing end.

15. The compound semiconductor device of claim 11, further comprising:
a thinned heavily doped semiconductor substrate adjacent a second main surface of the epitaxial layers facing away from the III-nitride compound semiconductor device structure; and
a metallization on a side of the thinned heavily doped semiconductor substrate facing away from the epitaxial layers, the metallization being electrically connected to the electrically conductive structure through the thinned heavily doped semiconductor substrate.

16. The compound semiconductor device of claim 11, further comprising a metallization on a second main surface of the epitaxial layers facing away from the III-nitride compound semiconductor device structure, and wherein the metallization contacts an end of the electrically conductive structure facing away from the III-nitride compound semiconductor device structure.

17. The compound semiconductor device of claim 11, wherein the III-nitride compound semiconductor device structure comprises:
one or more transition layers on the epitaxial layers;
GaN on the one or more transition layers; and
a GaN alloy on the GaN.

18. An RF compound semiconductor device, comprising:
a plurality of high-resistance crystalline silicon epitaxial layers;
a plurality of activated dopant regions disposed in a same region of at least some of the epitaxial layers so that the activated dopant regions align in a vertical direction perpendicular to a first main surface of the epitaxial layers;

an III-nitride compound semiconductor device structure disposed on the main surface of the epitaxial layers, the III-nitride compound semiconductor device structure including a source, a drain and a gate of an RF device;

a metallization on a second main surface of the epitaxial layers which opposes the first main surface; and an electrically conductive structure formed from the activated dopant regions, the electrically conductive structure contacting the metallization at one end and extending in the vertical direction through the epitaxial layers with the activated dopant regions toward the III-nitride compound semiconductor device structure and being electrically connected to the source of the RF device.

19. The RF compound semiconductor device of claim 18, wherein each epitaxial layer has at least one of the activated dopant regions.

20. The RF compound semiconductor device of claim 18, further comprising:

a trench extending in the vertical direction through the III-nitride compound semiconductor device structure to the activated dopant region closest to the III-nitride compound semiconductor device structure; and an electrically conductive material disposed in the trench which contacts the electrically conductive structure at a first end and contacts the source of the RF device at a second opposing end.

\* \* \* \* \*